(12) United States Patent
Feng et al.

(10) Patent No.: US 9,607,839 B2
(45) Date of Patent: Mar. 28, 2017

(54) NLDMOS TRANSISTOR AND FABRICATION METHOD THEREOF

(71) Applicant: Semiconductor Manufacturing International (Shanghai) Corporation, Shanghai (CN)

(72) Inventors: Zheyun Feng, Shanghai (CN); Ming Wang, Shanghai (CN); Qiancheng Ma, Shanghai (CN); Huifang Song, Shanghai (CN); Yong Cheng, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/940,709

(22) Filed: Nov. 13, 2015

(65) Prior Publication Data
US 2016/0155795 A1  Jun. 2, 2016

(30) Foreign Application Priority Data
Dec. 2, 2014  (CN) .......................... 2014 1 0720351

(51) Int. Cl.
| | | |
|---|---|---|
| *H01L 21/44* | (2006.01) | |
| *H01L 21/48* | (2006.01) | |
| *H01L 21/50* | (2006.01) | |
| *H01L 29/76* | (2006.01) | |
| *H01L 29/94* | (2006.01) | |
| *H01L 31/062* | (2012.01) | |
| *H01L 31/113* | (2006.01) | |
| *H01L 31/119* | (2006.01) | |
| *H01L 21/266* | (2006.01) | |
| *H01L 29/10* | (2006.01) | |
| *H01L 21/265* | (2006.01) | |
| *H01L 29/66* | (2006.01) | |
| *H01L 29/78* | (2006.01) | |

(Continued)

(52) U.S. Cl.
CPC ........ *H01L 21/266* (2013.01); *H01L 21/2652* (2013.01); *H01L 29/1083* (2013.01); *H01L 29/1095* (2013.01); *H01L 29/66689* (2013.01); *H01L 29/7816* (2013.01); *H01L 21/761* (2013.01); *H01L 29/0653* (2013.01)

(58) Field of Classification Search
CPC ........... H01L 21/823418; H01L 27/088; H01L 29/0623; H01L 21/266
USPC .................................. 257/337; 438/107, 216
See application file for complete search history.

(56) References Cited

U.S. PATENT DOCUMENTS

| | | | |
|---|---|---|---|
| 2015/0014771 A1* | 1/2015 | Brochu, Jr. ......... | H01L 29/7833 257/343 |
| 2015/0187934 A1* | 7/2015 | Zhang ................ | H01L 29/7817 257/338 |

* cited by examiner

*Primary Examiner* — David S Blum
(74) *Attorney, Agent, or Firm* — Anova Law Group, PLLC

(57) ABSTRACT

An N-type Lateral Diffused Metal-Oxide-Semiconductor (NLDMOS) transistor is provided. The NLDMOS transistor comprises a P-type substrate; and a semiconductor layer having a deep N-type well region formed on the P-type substrate. Further, the NLDMOS transistor also includes at least a P-type body region and an N-type drift region formed in the deep N-type well region; and an N-type heavily doped drain region formed in the N-type drift region. Further, the NLDMOS transistor includes a P-type doped reverse type region formed below the N-type drift region in the deep N-type well region, being physically connected with the first (Continued)

P-type body region, and preventing carriers from escaping between the N-type source region and external devices.

20 Claims, 4 Drawing Sheets

(51) Int. Cl.
*H01L 29/06* (2006.01)
*H01L 21/761* (2006.01)

NLDMOS TRANSISTOR AND FABRICATION METHOD THEREOF

CROSS-REFERENCES TO RELATED APPLICATIONS

This application claims the priority of Chinese patent application No. 201410720351.X, filed on Dec. 2, 2014, the entirety of which is incorporated herein by reference.

FIELD OF THE INVENTION

The present invention generally relates to the field of semiconductor manufacturing technology and, more particularly, relates to NLDMOS transistors and fabrication processes thereof.

BACKGROUND

Lateral Diffused Metal-Oxide-Semiconductor (LDMOS) transistors formed by Bipolar, CMOS or DMOS (BCD) processes have been widely used in radio frequency power amplifiers (RF PAs) and microwave power amplifiers (MW PAs), etc. NLDMOS transistors refer to N-type LDMOS transistors.

An NLDMOS transistor includes a P-type body (P-body) region and an N-type drift (N-drift) region. An N-type heavily doped source region is disposed in the P-body region; and an N-type heavily doped drain region is disposed in the N-drift region. Further, an insulation structure is also disposed in the N-drift region; and the insulation structure is disposed between the N-type heavily doped source region and the N-type heavily doped drain region. Further, a gate oxide layer and a gate are sequentially formed over a portion of the P-body region and a portion of the insulation structure.

Usually, some other devices are also formed on and/or in the substrate of the NLDMOS transistors. If the carriers of the devices diffuse into the substrate having the N-type heavily doped source region and the N-type heavily doped drain region, or the carriers of the N-type heavily doped source region and the N-type heavily doped drain region diffuse into the devices, interferences between devices would occur; and the performance of the NLDMOS transistor may be affected. Therefore, to prevent the diffusions between the devices formed in the substrate, a deep P-type doped well (DPW) region and a deep N-type doped well (DNW) region are often sequentially formed from inside to outside to cover the P-body region and the N-drift region of the NLDMOS transistor. The DPW and the DNW are able to increase the carrier insulation performance of the NLDMOS transistor.

However, the production cost of the NLDMOS transistors having such structures is relatively high. The disclosed device structures and methods are directed to solve one or more problems set forth above and other problems.

BRIEF SUMMARY OF THE DISCLOSURE

One aspect of the present disclosure includes providing an N-type Lateral Diffused Metal-Oxide-Semiconductor (NLDMOS) transistor. The NLDMOS transistor comprises a P-type substrate; and a semiconductor layer having a deep N-type well region formed on the P-type substrate. Further, the NLDMOS transistor also includes at least a first P-type body region and an N-type drift region formed in the deep N-type well region; and an N-type heavily doped drain region formed in the N-type drift region. Further, the NLDMOS transistor includes a P-type doped reverse type region formed below the N-type drift region in the deep N-type well region. The P-type doped reverse type region prevents carriers from escaping between the N-type source region and external devices.

Another aspect of the present disclosure includes providing a method for fabricating an NLDMOS transistor. The method includes providing a P-type substrate; and forming a semiconductor layer having a deep N-type well region. The method also includes forming at least a first P-type body region and an N-type drift region in the deep N-type well region; and forming a P-type ion implanting region below the N-type drift region in the deep N-type well region. Further, the method includes forming at least a first insulation structure in the N-type drift region; and forming at least a first gate structure covering a portion of the first P-type body region and a portion of the first insulation structure. Further, the method also includes forming a P-type doped reverse type region by causing the first P-type ion-implanting region to expand to physically connect with the first P-type body region.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 8:
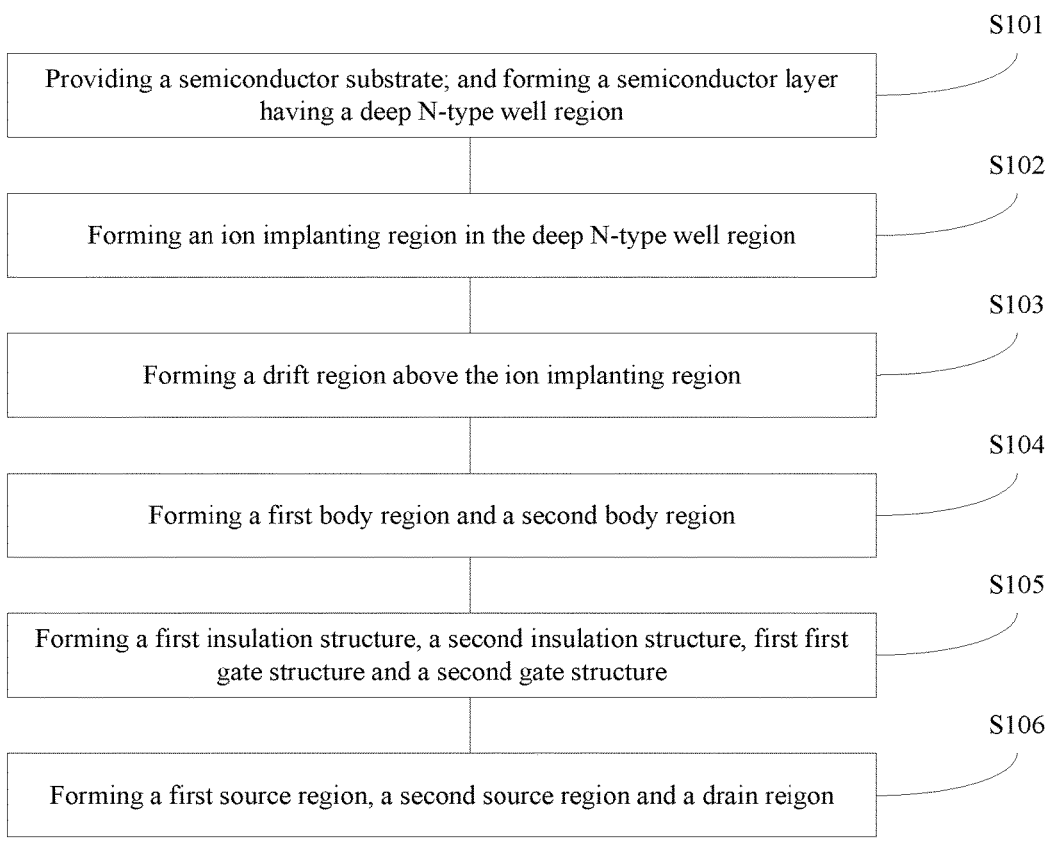
FIG. 8 illustrates an exemplary fabrication process of an NLDMOS transistor consistent with the disclosed embodiments.

FIG. 8 illustrates an exemplary fabrication process of an NLDMOS transistor consistent with the disclosed embodiments; and FIGS. 1~6 illustrate semiconductor structures corresponding to certain stages of the exemplary fabrication process.

Figure 1:
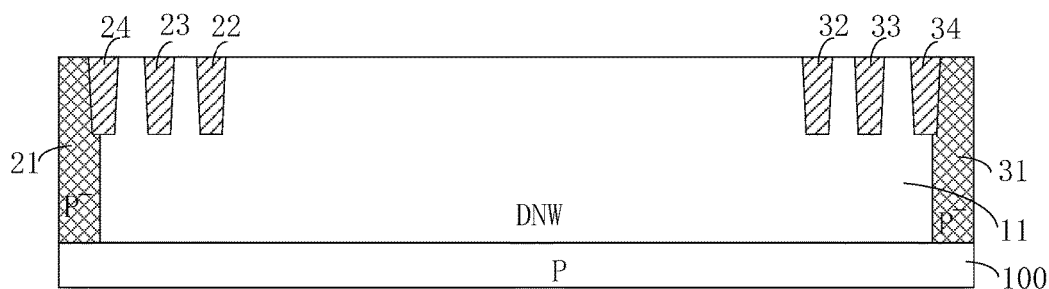
FIGS. 1~6 illustrate semiconductor structures corresponding to certain stages of an exemplary fabrication process of an NLDMOS transistor consistent with the disclosed embodiments.

As shown in FIG. 8, at the beginning of fabricationprocess, a semiconductor substrate with certain structures is provided (S101). FIG. 1 illustrates a corresponding semiconductor structure.

As shown in FIG. 1, a substrate 100 is provided. The substrate 100 may be a P-type substrate. A semiconductor layer (not labeled) having a deep N-type well (DNW) region 11 of the NLDMOS transistor may be formed on the P-type substrate 100. Further, a first P-type ion filling structure 21 and a second P-type ion filling structure 31 may be formed in the semiconductor layer on the substrate 100. The region enclosed by the first P-type ion filling structure 21, the second P-type ion filling structure 31 and the substrate 100 may form the DNW region 11 of the NLDMOS transistor.

Further, a plurality of shallow trench isolation structures (STIs) may be formed at pre-determined positions of the surface of the DNW region 11. For example, as shown in FIG. 1, STI 22, STI 23, STI 24, STI 32, STI 33 and STI 34 may be formed in the surface of the DNW region 11. Thus, active areas may be formed.

The STI 22 may be configured to insulate a first electrode region formed in a subsequently formed first P-body region and a subsequently formed first N-type doped source region. The first electrode region may be a P-type heavily doped region.

The STI 32 may be configured to insulate a second electrode region formed in a subsequently formed second P-type body region and a subsequently formed second N-type doped source region. The second electrode region may be a P-type heavily doped region.

The STI 23 may be configured to insulate the first electrode region and a third electrode region subsequently formed in the DNW region 11. The third electrode region may be an N-type heavily doped region.

The STI 33 may be configured to insulate the second electrode region and a fourth electrode region subsequently formed in the DNW region 11. The fourth electrode region may be N-type heavily doped region The STI 24 may be configured to insulate the third electrode region and a fifth electrode region subsequently formed in the first P-type ion filling structure. The fifth electrode region may be a P-type heavily doped region.

The STI 34 may be configured to insulate the third electrode region and a sixth electrode region subsequently formed in the second P-type ion filling structure. The sixth electrode region may be a P-type heavily doped region.

The substrate 100 may be made of any appropriate semiconductor materials, such as single crystal silicon, polysilicon, silicon on insulator (SOI), silicon germanium, carborundum, indium antimonite, lead telluride, indium arsenide, indium phosphide, gallium arsenide, gallium antimonite, alloy semiconductor or a combination thereof. Various processes may be used to dope the substrate 100 with P-type ions, such as an in situ doping process, an ion implantation process, or a thermal diffusion process, etc. The substrate 100 provides a base for subsequent devices and processes.

In one embodiment, the semiconductor layer having the DNW region 11 may be formed by forming a semiconductor material layer on the P-type substrate 100; and followed by an N-type ion implantation process. The semiconductor material layer may be made of any appropriate material, such as Si, Ge, or SiGe, etc. In one embodiment, the semiconductor material layer is made of Si.

Various processes may be used to form the semiconductor material layer, such as a chemical vapor deposition (CVD) process, a physical vapor deposition (PVD) process, an atomic layer deposition (ALD) process, an epitaxial growth process, or a flowable CVD (FCVD) process, etc. In one embodiment, an epitaxial growth process is used to form the semiconductor material layer.

The doping ions of the ion implantation process may be any appropriate ions. In one embodiment, the doping ions are phosphors ions.

After forming the semiconductor layer having the DNW region 11, two parallel trenches (not shown) may be formed in the semiconductor layer. Then, the two parallel trenches may be filled with appropriate materials. Thus, the first P-type ion filling structure 21 and the second P-type ion filling structure 31 may be formed.

The two parallel trenches may be formed by any appropriate process, such as a dry etching process, a wet etching process, or an ion beam etching process. The first P-type ion filling structure 21 and the second P-type ion filling structure 31 may be made of any appropriate material. In one embodiment, the first P-type ion filling structure 21 and the second P-type ion filling structure 31 are made of lightly doped P-type polysilicon.

In certain other embodiments, the first P-type ion filling structure 21 and the second P-type ion filling structure 31 may be formed in the semiconductor material layer firstly by any appropriate process. Then, the first P-type ion filling structure 21 and the second P-type ion filling structure 31 may be covered; and an N-type heavily doping ion implantation process may be performed onto the exposed portion of the semiconductor material layer. Thus, the DNW region 11 may be formed in the semiconductor layer having the first P-type ion filling structure 21 and the second P-type ion filling structure 31.

The STI structures may be formed by any appropriate processes. Various materials may be used to form the STI structures, such as silicon oxide, silicon nitride, or silicon oxynitride, etc.

Figure 2:
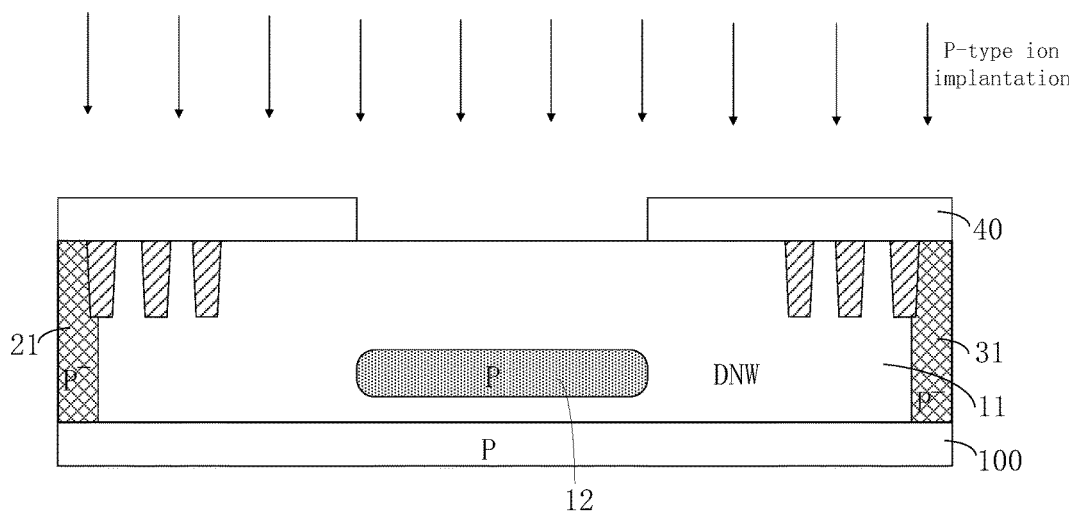

Returning to FIG. 8, after providing the P-type substrate 100 and forming the DNW region 11 and the plurality of STI structures, an ion-implanting region may be formed (S102). FIG. 2 illustrates a corresponding structure.

As shown in FIG. 2, an ion-implanting region 12 is formed in the DNW region 11. In one embodiment, the ion-implanting region 12 is P-type doped; and may be referred as a P-type ion-implanting region 12. The P-type ion-implanting region 12 may be used to subsequently form a reverse-type region.

In one embodiment, the P-type ion-implanting region 12 may be formed by forming a first patterned mask layer 40 on the DNW region 11; and followed by an ion implantation process. The first patterned mask layer 40 may be made of any appropriate material, such as silicon oxide, silicon nitride, or photoresist, etc. In one embodiment, the first patterned mask layer 40 is made of photoresist; and patterned by an exposure step and a developing step, etc.

Various types of ions may be used in the ion implantation process for forming the P-type ion-implanting region 12. In one embodiment, the P-type ions are phosphor ions.

In certain other embodiments, the P-type ion-implanting region 12 may be formed before forming the STI structures. After forming the P-type ion-implanting region 12, the P-type ion-implanting region 12 may be covered by any appropriate material; and then the STI structures may be formed.

Figure 3:
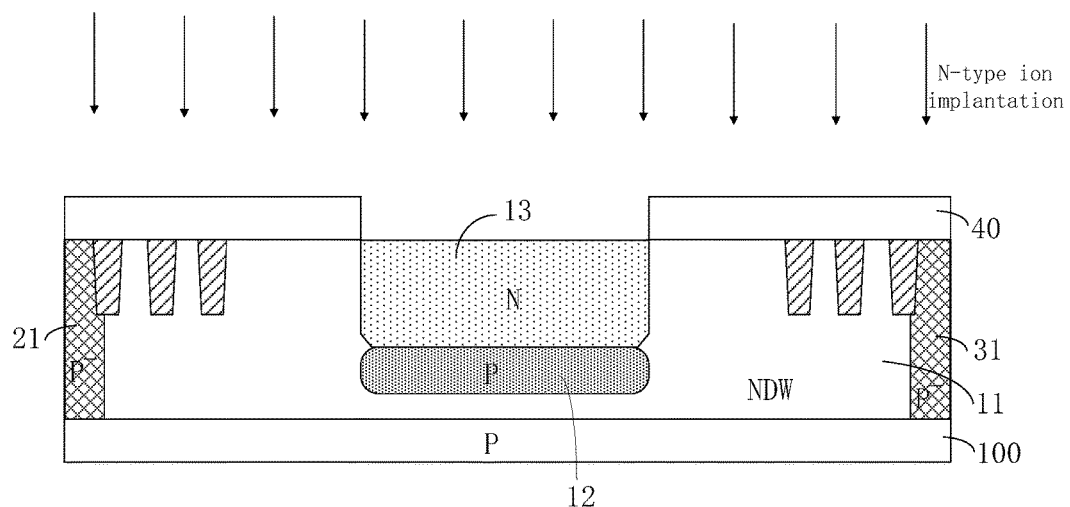

Returning to FIG. 8, after forming the P-type ion-implanting region 12, a drift region may be formed (S103). FIG. 3 illustrates a corresponding structure.

As shown in FIG. 3, a drift region 13 is formed in the DNW region 11. In one embodiment, the drift region 13 is N-type doped; and may be referred as an N-type drift region 13. The N-type drift region 13 may be physically connected with the P-type ion-implanting region 12. In certain other embodiments, the N-type drift region 13 may be unnecessarily connected with the P-type ion-planting region 12.

The N-type drift region 13 may be formed by any appropriate process, such as an ion implantation process, or a thermal diffusion process, etc. In one embodiment, the N-type drift region 13 is formed by an ion implantation process using the first patterned mask layer 40 as a mask. By using the existing first patterned mask layer 40 as a mask, the production cost of NLDMOS transistor may be reduced. In certain other embodiments, the patterned mask layer 40 may be removed after forming the P-type ion-implanting region 12; and another mask layer may be formed for forming the N-type drift region 13 by the ion implantation process. The doping ions of the ion implantation process may be any appropriate ions, such as phosphor ions, etc.

In certain other embodiments, the N-type drift region 13 may be formed firstly; and then the P-type ion-implanting region 12 may be formed.

After forming the N-type drift region 13, the first patterned mask layer 40 may be removed. The first patterned mask layer 40 may be removed by any appropriate process, such as a dry etching process, a wet etching process, or a plasma ashing process. In one embodiment, the first patterned mask layer 40 is made of photoresist, a plasma ashing process may be used to remove the first patterned mask layer 40. In certain other embodiments, the first patterned mask layer 40 may be made of silicon nitride; a wet etching process using a hot phosphorus acid solution may be used to remove the first patterned mask layer 40.

Figure 4:
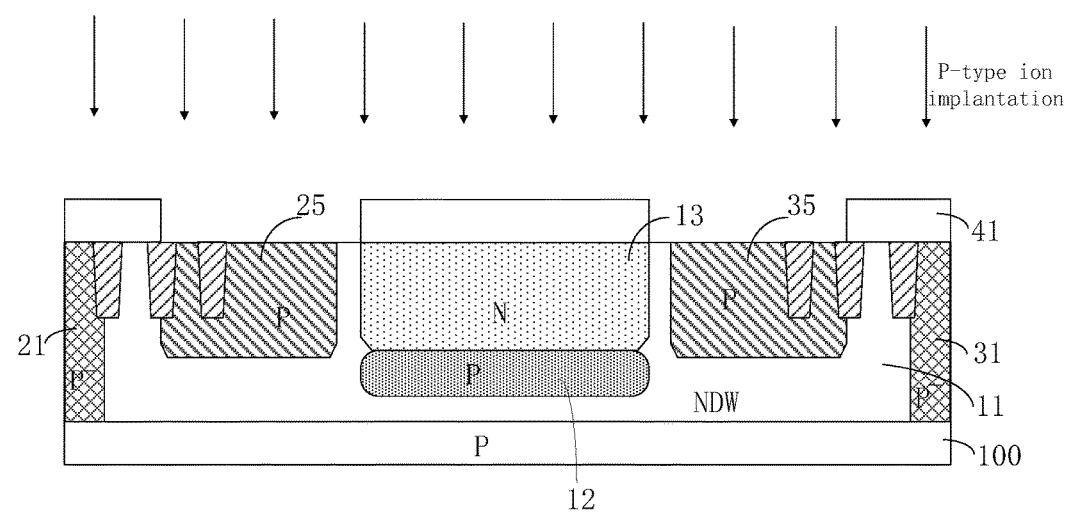

Returning to FIG. 8, after forming the N-type drift region 13, a first body region and a second body region may be formed (S104). FIG. 4 illustrates a corresponding structure.

As shown in FIG. 4, a first body region 25 and a second body region 35 are formed in the DNW region 11. The first body region 25 may be P-type doped; and may be referred as a first P-type body region 25. The second body region 35 may also be P-type doped; and may be referred as a second P-type body region 25. The first P-type body region 25 and the second P-type body region 35 may be at both sides of the N-type drift region 13, respectively. Further, the first P-type body region 25 and the second P-type body region 35 may not physically connect with the N-type drift region 13. That is, the first P-type body region 25 and the N-type drift region 13 may be separated by a portion of the DNW region 11; and the second P-type body region 35 and the N-type drift region 13 may be separated by a portion of the DNW region 11.

In certain other embodiments, the first P-type body region 25 and the N-type drift region 13 may physically contact, but not overlap; and the second P-type body region 35 and the N-type drift region 13 may physically contact, but not overlap.

The first P-type body region 25 and the second P-type body region 35 may be formed by forming a second patterned mask layer 41 on the DNW region 11; and followed by a P-type ion implantation process. The second patterned mask layer 41 may cover the N-type drift region 13, the first P-type ion filling structure 21, the second P-type ion filling structure 31, the STI 24, the STI 34, a portion of the STI 23, a portion of the STI 33, a portion of the DNW region 11 between the STI 23 and the STI 24, and a portion of the DNW 11 between the STI 33 and the STI 34. The doping ions are P-type ions.

In certain other embodiments, the first P-type body region 25 and the second P-type body region 35 may be formed using the second patterned mask layer 41 firstly; and then the P-type ion implanting region 12 and the N-type drifting region 13 may be formed using first patterned mask layer 40.

Figure 5:
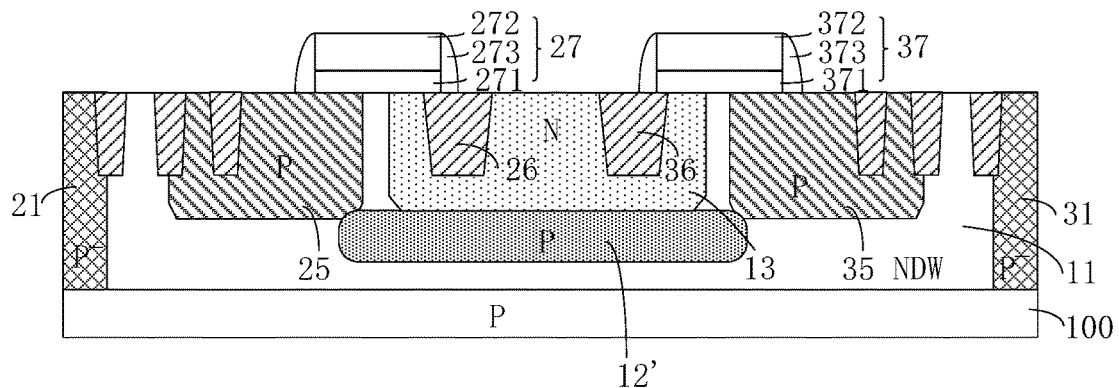

Returning to FIG. 8, after forming the N-type drift region 13, insolation structures and gate structures may be formed (S105). FIG. 5 illustrates a corresponding semiconductor structure.

As shown in FIG. 5, a first insolation structure 26 and a second insolation structure 36 are formed in the N-type drift region 13. Further, a first gate structure 27 and a second gate structure 37 are formed on the first P-type body region 25, the second P-type body region 35 and the N-type drift region 13. Specifically, the first gate structure 27 may cover a portion of the first P-type body region 25 and a portion of the first insolation structure 26; and the second gate structure 37 may cover a portion of the second P-type body region 35 and a portion of the second insolation structure 36.

The first gate structure 27 may include a first gate insulation layer 271 formed on the portion of the first P-type body region 25 and the portion of the first insolation structure 26; a first gate layer 272 formed on the first gate insulation layer 271; and a first sidewall spacer 273 formed on the side surfaces of the first gate insulation layer 271 and the first gate layer 272. The second gate structure 37 may include a second gate insulation layer 371 formed on the portion of the second P-type body region 35 and the portion of the second insolation structure 36; a second gate layer 372 formed on the second gate insulation layer 371; and a second sidewall spacer 373 formed on side surfaces of the second gate insulation layer 371 and the second gate layer 372.

In one embodiment, the first gate insulation layer 271 and the second gate insulation layer 371 may be formed by a same step; the first gate layer 272 and the second gate layer 372 may be formed by a same step; and the first sidewall spacer 273 and the second sidewall spacer 373 may be formed by a same step. In certain other embodiments, the first gate insulation layer 271 and the second gate insulation layer 371 may be formed by separated steps; the first gate layer 272 and the second gate layer 372 may be formed by separated steps; and the first sidewall spacer 273 and the second sidewall spacer 373 may be formed by separated steps.

The first gate insulation layer 271 and the second gate insulation layer 371 may be made of any appropriate material, such silicon oxide, silicon nitride, silicon oxynitride, or high dielectric constant (high-K) material, etc. In one embodiment, the first gate insulation layer 271 and the second gate insulation layer 371 are made of silicon oxide.

The first gate layer 272 and the second gate layer 372 may be made of any appropriate material, such as metal material, polysilicon, or doped polysilicon, etc. In one embodiment, the first gate layer 272 and the second gate layer 372 are made of polysilicon.

In one embodiment, a process for forming the first gate insulation layer 271, the second gate insulation layer 371, the first gate layer 272 and the second gate layer 372 may include forming a gate insulation layer over the first P-type body region 25, the second P-type body region 35, the N-type drift region 13, the first insulation structure 26 and the second insulation structure 36; forming a gate material layer on the gate insulation layer; and followed by etching the gate material layer and the gate insulation layer to form the first gate insulation layer 271, the second gate insulation layer 371, the first gate layer 272, and the second gate layer 372.

Various processes may be used to form the gate insulation layer and the gate material layer, such as a chemical vapor deposition (CVD) process, a physical vapor deposition (PVD) process, an atomic layer deposition (ALD) process, or a flowable CVD (FCVD) process, etc. In one embodiment, the gate insulation layer and the gate material layer are formed by a CVD process in a tube furnace.

Specifically, a silicon oxide layer may be formed over the first P-type body region 25, the second P-type body region 35, the N-type drift region 13, the first insulation structure 26 and the second insulation structure 36 by a CVD process in tube furnace. The temperature of the CVD process may be in a range of approximately 800° C.~1200° C. Then, a polysilicon layer may be formed by a CVD process in the same tube furnace. The temperature of the CVD process may be in a range of approximately 500° C.~900° C.

After forming the silicon oxide layer and the polysilicon layer, the silicon oxide layer and the polysilicon layer may be etched until the surface of the first P-type body region 25 and the second P-type body region 35 is exposed. Thus, two stacked structures may be formed. A first stacked structure may include the first gate insulation layer 271 and the first gate layer 272 of the first gate structure 27; and a second stacked structure may include the second gate insulation layer 371 and the second gate layer 372 of the second gate structure 37.

After forming the two stacked structures, a silicon oxide layer, a silicon nitride layer and a silicon oxide layer (may be referred as an ONO structure) may be sequentially formed over the two stacked structures, the first P-type body region 25, the second P-type body region 35, the N-type drift region 13, the first insulation structure 26 and the second insulation structure 36; and followed by an etch-back process. Thus, the first sidewall spacer 273 may be formed around the first stacked structure; and the second sidewall spacer 373 may be formed around the second stacked structure. Therefore, the first gate structure 27 and the second gate structure 37 may be formed.

The silicon oxide layer, the silicon nitride layer and the silicon oxide layer may be formed by any appropriate process, such as a CVD process, a PVD process, or an FCVD process, etc. In one embodiment, the silicon nitride layer and the silicon oxide layer may be formed by a CVD process. The temperature of the CVD process may be in a range of approximately 500° C.~900° C.

The processes for forming the silicon oxide layer, the polysilicon layer and the silicon nitride layer may all be high temperature processes, the P-type ion implantation region 12 may be expanded under the high temperature because of the diffusion of the doping ions. Thus, the P-type ion-implanting region 12 may physically connect with the first P-type body region 25 and the second P-type body region 35. The doping type of the P-type ion-implanting region 12 and the doping type of the N-type drift region 13 may be opposite to each other. Thus, the expanded P-type ion-implanting region 12 may be referred as a reverse-type region 12'.

In certain other embodiments, if the P-type ion implanting region 12 and the N-type drift region 13 are not physically connected, the P-type ion implanting region 12 may still be expanded upwardly during the high temperature process; and may physically connect with the N-type drift region 13.

In one embodiment, the formation of the reverse type region 12' by expanding the P-type ion-implanting region 12 may utilize one or more of the high temperature processes for forming the silicon oxide layer, the poly silicon layer and the ONO structure. In certain other embodiments, the high temperature process for expanding the P-type ion-implanting region 12 to form the opposite-type region 12' may be an extra process. For example, a high temperature process with a temperature in a range of approximately 700° C.~1300° C. may be used to cause the P-type ion-implanting region 12 to expand to connect with the first P-type body region 25 and the second P-type body region 35.

The first insulation structure 26 and the second insulation structure 36 may be STI structures. The STI structures may be made of silicon oxide, silicon nitride, or silicon oxynitride, etc.

Figure 6:
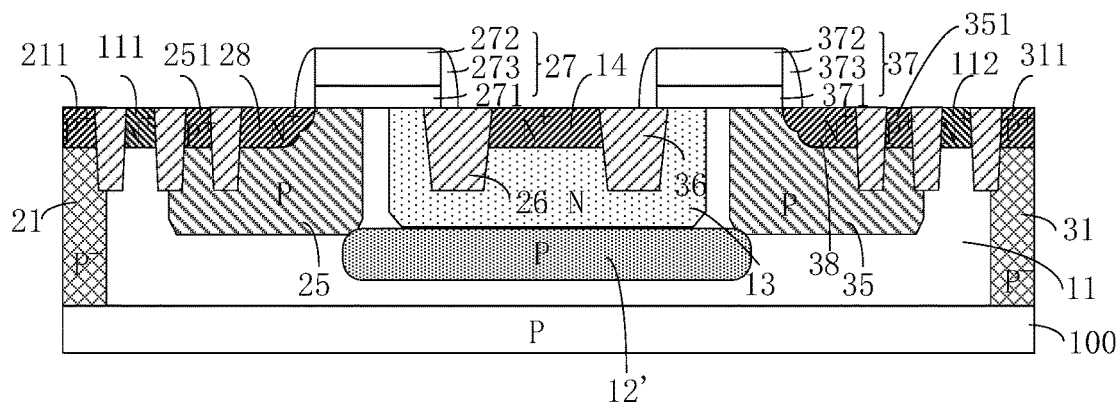

Returning to FIG. 8, after forming the first gate structure 27, the second gate structure 37 and the reverse type region 12', source regions and a drain region may be formed (S106). FIG. 6 illustrates a corresponding semiconductor structure.

As shown in FIG. 6, a first N-type heavily doped source region 28 and a second heavily doped source region 38 are formed in the first P-type body region 25 and the second P-type body region 35, respectively. The first N-type heavily doped source region 28 may be formed in the first P-type body 25 at one side of the first gate structure 27 away from the N-type drift region 13. The second N-type heavily doped source region 38 may be formed in the second P-type body region 35 at one side of the second gate structure 37 away from the N-type drift region 13. Further, an N-type heavily doped drain region 14 is formed in the N-type drift region 13. The N-type heavily doped drain region 14 may be in between the first insulation structure 26 and the second insulation structure 36.

The first N-type heavily doped source region 28, the second N-type heavily doped source region 38 and the N-type heavily doped drain region 14 in the N-type drift region 13 may all be heavily doped with N-type ions. Thus, the first N-type heavily doped source region 28, the second N-type heavily doped source region 38 and the N-type heavily doped drain region 14 may be formed by a same doping process using one patterned mask layer.

Further, a third electrode region 111 and a fourth electrode region 112 may be formed in the DNW region 11. The third electrode region 111 may be formed in the DNW region 11 between the STI 23 and the STI 24; and the fourth electrode region 112 may be formed in the DNW region 11 between the STI 33 and the STI 34. The third electrode region 111 and the fourth electrode region 112 may be heavily doped to provide voltages to the DNW region 11.

The third electrode region 111 and the fourth electrode region 112 may be N-type heavily doped. Thus, the third electrode region 111 and the fourth electrode region 112 may be formed by the same doping process for forming the first N-type heavily doped source region 28, the second N-type heavily doped source region 38 and the N-type heavily doped drain region 14 using a same patterned mask layer.

In certain other embodiments, the first electrode region 111 and the fourth electrode region 112, the first N-type heavily doped source region 28, the second N-type heavily doped source region 38 and the N-type heavily doped drain region 14 may be formed by individual doping processes using different patterned mask layer.

Further, a first electrode region 251 may be formed in the DNW region 11 between the STI 22 and the STI 23; and a second electrode region 351 may be formed in the DNW region 11 between the STI 33 and the STI 34. The first electrode region 251 may provide a voltage to the first P-type body region 25; and the second electrode region 351 may provide a voltage to the second P-type body region 35.

The first electrode region 251 and the second electrode region 351 may be P-type doped. Specifically, a second patterned mask layer may be formed over the first P-type body region 25 and the second P-type body region 35; and followed by a P-type heavily doping process.

Further, a fifth electrode region 211 may be formed in the first ion filling structure 21; and a sixth electrode region 311 may be formed in the second ion filling structure 31. The fifth electrode region 211 and the sixth electrode region 311 may provide voltage to the first ion filling structure 21 and the second ion filling structure 31 respectively.

In one embodiment, the fifth electrode region 211 and the sixth electrode region 311 may be P-type doped. Thus, the fifth electrode region 211 and the sixth electrode region 311 may be formed with the same P-type heavily doping process for forming the first electrode region 251 and the second electrode region 351. In certain other embodiments, the fifth electrode region 211, the sixth electrode region 311 the first electrode region 251 and the second electrode region 351 may be formed by different P-type heavily doping processes using different patterned mask layers.

In one embodiment, the first electrode region 251 and the first N-type heavily doped source region 28 may be isolated by the STI 22. In certain other embodiments, the first electrode region 251 and the first N-type heavily doped source region 28 may connect. That is, there is no isolation structure between the first electrode region 251 and the first N-type heavily doped source region 28.

Thus, as shown in FIG. 6, after forming the first N-type heavily doped source region 28, the second N-type heavily doped source region 38 and the N-type heavily-doped drain region 14, the portion of the first P-type body region 25 covered by the first gate structure 27 may form a first channel region; and the portion of the second P-type body region 35 covered by the second gate structure 37 may form a second channel region.

Metal interconnect structures (not shown) may be formed over the semiconductor structure having the first gate structure 27 and the second gate structure 37. The metal interconnect structures may be used to electrically connect the first gate layer 272, the second gate layer 372, the first N-type heavily doped source region 28, the second N-type heavily doped source region 38, the N-type heavily doped drain region 14, the first electrode region 251, the second electrode region 351, the third electrode region 111, the fourth electrode region 112, the fifth electrode region 211 and the sixth electrode region 311, respectively.

The P-type heavily doping process and the N-type heavily doping process for forming the disclosed structures may be performed by same ion implantation processes (N-type ion implantation processes, and/or P-type ion implantation processes) for forming other CMOS devices, and/or P-type Lateral Diffused Metal-Oxide-Semiconductor (PLDMOS) transistors using same patterned mask layers. Thus, the production cost may be reduced.

Figure 7:
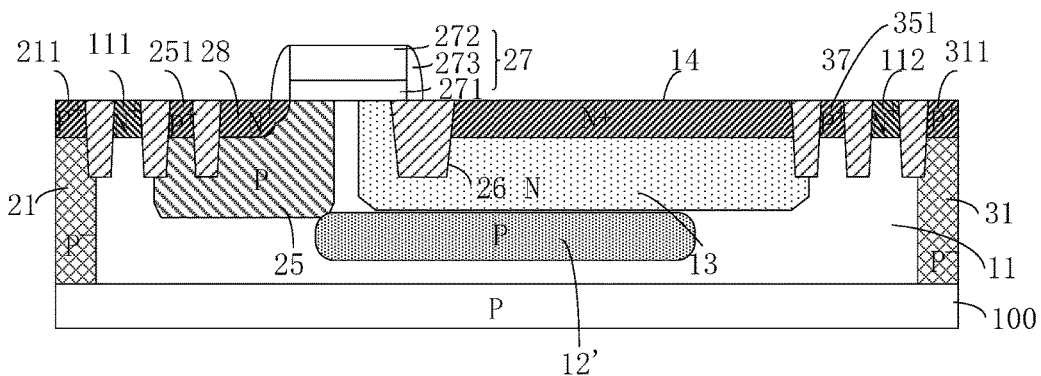
FIG. 7 illustrates another exemplary NLDMOS transistor consistent with the disclosed embodiments.

In certain other embodiments, as shown in FIG. 7, the second P-type body region 35 may be omitted. Correspondingly, the second gate structure 37, and the second insulation structure 36 shown in FIG. 6 may also be omitted. The N-type heavily doped drain region 14 may be physically connected with the STI 32. Similarly, the production cost of such an NLDMOS transistor may be reduced.

Thus, an NLDMOS transistor may be formed by the above-disclosed processes and methods; and the corresponding NLDMOS transistor is illustrated in FIG. 6. As shown in FIG. 6, the NLDMOS transistor may include a P-type substrate 100, and a semiconductor layer having a deep N-type doped well (DNW) region 11. The NLDMOS transistor may also include a first P-type body region 25 and a second P-type body region 35 formed in the DNW region 11; and an N-type drift region 13 formed in the DNW region 11 between the first P-type body region 25 and the second P-type body region 35. Further, the NLDMOS transistor may also include an N-type heavily doped drain region 14, a first insulation structure 26 and a second insulation structure 36 formed in the N-type heavily doped drain region 14. The N-type heavily doped drain region 14 may be in between the first insulation structure 26 and the second insulation structure 36. The first insulation structure 26 may be close to the first P-type body region 25; and the second insulation structure 36 may be close to the second P-type body region 35.

Further, the NLDMOS transistor may also include a reverse type region 12' formed below the N-type heavily doped drain region 14. The reverse type region 12' may be P-type doped. Further, the reverse type region 12' may be in the deep N-type doped (DNW) region 11, and may be physically connected with the first P-type body region 25, the N-type drift region 13, and the second P-type body region 35, respectively. In certain other embodiments, the reverse type region 12' may not be physically connected with the N-type drift region 13.

Further, the NLDMOS transistor may also include a first N-type heavily doped source region 28 in the first P-type body region 25, and a second N-type heavily doped source region 38 formed in the second P-type body region 35.

Further, the NLDMOS transistor may also include a first gate structure 27 covering a portion of the first P-type body region 25 and a portion of the first insulation structure 26; and a second gate structure 37 covering a portion of the second P-type body region 35 and a portion of the second insulation structure 36.

Thus, for the first P-type body region 25, a depletion layer may be formed at the interface layer between the first P-type body region 25 and the DNW region 11. Such a depletion layer may be able to prevent the carriers in the first N-type heavily doped source region 28 in the first P-type body region 25 and the carriers in the first channel region from escaping to external devices. It may also be able to prevent the carriers in the external devices from entering into the first N-type heavily doped source region 28 in the first P-type body region 25 and the first channel region.

For the N-type drift region 13, a depletion layer may be formed at the interface between the bottom of the N-type drift region 13 and the reverse-type region 12'. Such a depletion layer may be able to prevent the carriers in the N-type heavily doped drain region 14 in the N-type drift region 13 from escaping to external devices. It may also be able to prevent the carriers in the external devices from entering into the N-type heavily doped drain region 14 in the N-type drift region 13.

Further, for the second P-type body region 35, a depletion layer maybe formed at the interface layer between the second P-type body region 35 and the DNW region 11. Such a depletion layer may be able to prevent the carriers in the second N-type heavily doped source region 38 in the first P-type body region 25 and the carriers in the second channel region from escaping to external devices. It may also be able to prevent the carriers in the external devices from entering into the second N-type heavily doped source region 38 in the second P-type body region 35 and the first channel region. Thus, the NLDMOS transistor having such a structure may be able to prevent the signal interfering between the NLDMOS transistor and other devices.

Further, as shown in FIG. 6, to further improve the ability for preventing the signal interfering, a first P-type ion filling structure 21 and a second P-type ion filling structure 31 may formed in the semiconductor layer. The first P-type ion filling structure 21 and the second P-type ion filling structure 31 may be parallel to each other; and may contact with surface of the P-type substrate 100. The region of the semiconductor layer enclosed by the first ion filling structure 21, the second ion filling structure 31 and the P-type substrate 100 may be the DNW region 11.

A depletion layer may be formed at the interface between the first P-type ion filling structure 21 and the DNW 11, the interface between the second P-type ion filling structure 31 and the DNW 11, and the interface between the P-type substrate and the DNW 11. Such a depletion layer may be able to prevent the carriers in the DNW region 11 from escaping to other devices. It may also be able to prevent the carriers in other devices from entering into the DNW region 11.

Further, the NLDMOS transistor may also include a first electrode region 251 formed in the first P-type body region 25; and a second electrode region 351 formed in the second P-type body region 35. The first electrode region 251 and the second electrode region 351 may be P-type heavily doped. The first electrode region 251 may provide a voltage to the first P-type body region 25; and the second electrode region 351 may provide a voltage to the second P-type body region 35.

Further, the NLDMOS transistor may also include a third electrode region 111 and a fourth electrode region 112. The third electrode region 111 and the fourth electrode region 112 may be N-type heavily doped. The third electrode region 111 and the fourth electrode region 112 may provide a voltage to the DNW region 11.

Further, the NLDMOS transistor may also include a fifth electrode 211 and a sixth electrode 311. The fifth electrode 211 and the sixth electrode 311 may be P-type heavily doped. The fifth electrode region 211 may provide a voltage to the first P-type ion filling structure 21; and the sixth electrode region 311 may provide a voltage to the second P-type ion filling structure 31.

Further, as shown in FIG. 6, the NLDMOS transistor may be axisymmetric with the DNW region 11. That is, the function of the structures at both sides of the central axis of the P-type substrate 100 may be identical. Such a structure may simplify the fabrication process; and the first electrode 272 and the second electrode layer 372 may apply signals to the NLDMOS transistor simultaneously.

Thus, according to the disclosed embodiments, for an NLDMOS transistor, a reverse type region may be disposed below the N-type drift region. The reverse type region may be P-type doped. The reverse type region may be formed in the deep N-type well (DNW) region; and may be physically connected with a first P-type body region and a second P-type body region formed in the DNW region. Therefore, for the first P-type body region, a depletion layer may be formed at the interface layer between the first P-type body region and the DNW region. Such a depletion layer may be able to prevent the carriers in the first N-type heavily doped source region in the first P-type body region and the carriers in the first channel region from escaping to external devices. It may also be able to prevent the carriers in the external devices from entering into the first N-type heavily doped source region in the first P-type body region and the first channel region.

For the N-type drift region, a depletion layer may be formed at the interface between the bottom of the N-type drift region and the reverse type region. Such a depletion layer may be able to prevent the carriers in the N-type heavily doped drain region in the N-type drift region from escaping to external devices. It may also be able to prevent the carriers in the external devices from entering into the N-type heavily doped drain region in the N-type drift region.

Further, for the second P-type body region, a depletion layer may be formed at the interface layer between the second P-type body region and the DNW region. Such a depletion layer may be able to prevent the carriers in the second N-type heavily doped source region in the first P-type body region and the carriers in the second channel region from escaping to external devices. It may also be able to prevent the carriers in the external devices from entering into the second N-type heavily doped source region in the second P-type body region and the first channel region. Thus, the NLDMOS transistor having such a structure may be able to prevent the signal interfering between the NLDMOS transistor and other devices.

Therefore, comparing with an existing fabrication process of an NLDMOS transistor, it may only need to form a reverse type region below the N-type drift region; and cause the reverse type region to physically connect with the first P-type body region and the second P-type body region to avoid the signal interfering between devices; and the formation of deep P-type well region (DPW) for covering the first P-type body region, the second P-type body region and the N-type drift region may be omitted. Thus, the production cost of the NLDMOS transistor may be reduced.

Further, the formation of the reverse type region and the N-type drift region may all include ion implantation processes. Thus, during the ion implantation processes for forming the reverse type region and the N-type drift region, a same patterned mask layer may be used. Therefore, comparing the process which utilizes the deep P-type well (DPW) region to cover the first P-type body region, the N-type drift region and the second P-type body region, the mask layer for forming the DPW may be saved; and the production cost of the NLDMOS transistor may be further reduced.

Further, the reverse type region may be formed by a thermal diffusion process. The heat for the thermal diffusion process may be provided by the subsequent processes, such as the high temperature processes for forming the first gate structure, and the second gate structure, etc. Thus, the production cost of the NLDMOS transistor may be further reduced.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. An N-type Lateral Diffused Metal-Oxide-Semiconductor (NLDMOS) transistor, comprising:
    a P-type substrate;
    a semiconductor layer having a deep N-type well region formed on the P-type substrate;
    at least a first P-type body region and an N-type drift region formed in the deep N-type well region;
    a second P-type body formed in the deep N-type well region, with the N-type drift region in between the first P-type body region and the second P-type body region;
    an N-type heavily doped drain region formed in the N-type drift region; and
    a P-type doped reverse type region physically connected with the P-type body region and preventing carriers from escaping between the N-type source region and external devices formed below the N-type drift region.

2. The NLDMOS transistor according to claim 1, further including:
    at least a first insulation structure formed in the N-type drift region between the N-type heavily doped drain region and the first P-type body region;
    at least a first N-type heavily doped source region formed in the first P-type body region; and
    at least a first gate structure covering a portion of the first P-type body region and a portion of the first insulation structure.

3. The NLDMOS transistor according to claim 1, further including:

a first P-type ion filing structure and a second P-type ion filling structure penetrating through the semiconductor layer, wherein the first P-type ion filling structure and the second P-type ion filling structure are parallel; and the semiconductor layer enclosed by the first P-type ion filling structure, the second P-type ion filling structure and the P-type substrate forms the deepN-type well region.

4. The NLDMOS transistor according to claim 1, wherein:
the first insulation structure is a shallow trench isolation structure.

5. The NLDMOS transistor according to claim 1, further including:
a second N-type heavily doped source region formed in the second P-type body region.

6. The NLDMOS transistor according to claim 1, further including:
a second insulation structure formed in the N-type drift, with the N-type highly doped drain region in between the first insulation structure and the second insulation structure.

7. The NLDMOS transistor according to claim 1, further including:
a second gate structure covering a portion of the second P-type body region and a portion of the second insulation structure.

8. The NLDMOS transistor according to claim 5, further including:
a second electrode region formed in the second P-type body region, being P-type heavily doped, and insulated from the second N-type heavily doped source region by a shallow trench isolation structure.

9. An N-type Lateral Diffused Metal-Oxide-Semiconductor (NLDMOS) transistor, comprising:
a P-type substrate;
a semiconductor layer having a deep N-type well region formed on the P-type substrate;
at least a first P-type body region and an N-type drift region formed in the deep N-type well region;
an N-type heavily doped drain region formed in the N-type drift region;
a P-type doped reverse type region physically connected with the P-type body region and preventing carriers from escaping between the N-type source region and external devices formed below the N-type drift region; and
a first electrode region formed in the first P-type body region, being P-type heavily doped, and insulated from a first N-type heavily doped source region formed in the first P-type body region by a shallow trench isolation structure.

10. The NLDMOS transistor according to claim 9, further including:
a third electrode region formed in the deep N-type well region between the first electrode region and the first P-type ion filling structure, being N-type heavily doped; and
a fourth electrode region formed in the deep N-type well region between the second electrode and the second P-type filling structure, being N-type heavily doped.

11. The NLDMOS transistor according to claim 9, further including:
a fifth electrode region formed in the first P-type ion filling structure, being P-type heavily doped; and a sixth electrode region formed in the second P-type ion filling structure, being P-type heavily doped.

12. The NLDMOS transistor according to claim 9, wherein:
the NLDMOS transistor is axisymmetric with the N-type drift region.

13. The NLDMOS transistor according to claim 9, further including:
a first P-type ion filing structure and a second P-type ion filling structure penetrating through the semiconductor layer,
wherein the first P-type ion filling structure and the second P-type ion filling structure are parallel; and the semiconductor layer enclosed by the first P-type ion filling structure, the second P-type ion filling structure and the P-type substrate forms the deepN-type well region.

14. The NLDMOS transistor according to claim 9, further including:
a second N-type heavily doped source region formed in the second P-type body region.

15. A method for fabricating an NLDMOS transistor, comprising:
providing a P-type substrate;
forming a semiconductor layer having a deep N-type well region;
forming at least a first P-type body region and an N-type drift region in the deep N-type well region;
forming a second P-type body region in the deep N-type well region, with the N-type drift region in between the first P-type body region and the second P-type body region;
forming a P-type ion implanting region below the N-type drift region;
forming at least a first insulation structure in the N-type drift region;
forming at least a first gate structure covering a portion of the first P-type body region and a portion of the first insulation structure; and
forming a reverse type region by causing the first P-type ion implantation region to expand to physically connect with the first P-type body region.

16. The method according to claim 15, further including:
forming a second insulation structure in the N-type drift region, with the first insulation structure close to the first P-type body region and the second insulation structure close to the second P-type body region.

17. The method according to claim 16, further including:
forming a second gate structure covering a portion of the second P-type body region and a portion of the second insulation structure.

18. The method according to claim 15, wherein:
The P-type ionimplanting region and the N-type drift region are formed by ion implantation processes using a same mask.

19. The method according to claim 17, wherein:
the reverse type region is formed by a thermal diffusion process using heat from one of processes forming the first gate structure and the second gate structure, and a separated thermal annealing process.

20. The method according to claim 15, further including:
a process for forming the first P-type body and the second P-type body region shares a same mask with one of the processes for forming compatible CMOS devices and a P-type Lateral Diffused Metal-Oxide-Semiconductor (PLDMOS) transistor.

* * * * *